United States Patent [19]
Yoshida et al.

[11] Patent Number: 5,901,005
[45] Date of Patent: May 4, 1999

[54] MAGNETIC RECORDING AND REPRODUCING APPARATUS HAVING A DRUM PREAMPLIFIER WITH IMPROVED S/N AND DYNAMIC RANGE

[75] Inventors: Teruyuki Yoshida; Hideki Arai; Keiko Kanetsuka, all of Kanagawa, Japan

[73] Assignee: Sony Corporation, Tokyo, Japan

[21] Appl. No.: 08/128,053

[22] Filed: Sep. 28, 1993

Related U.S. Application Data

[63] Continuation of application No. 07/798,183, Nov. 26, 1991, abandoned.

[30] Foreign Application Priority Data

Nov. 30, 1990 [JP] Japan ................................ P 2-339767

[51] Int. Cl.⁶ ........................................................ G11B 5/03
[52] U.S. Cl. .................................. 360/66; 360/46; 360/68
[58] Field of Search ................................ 360/65, 66, 67, 360/68, 46

[56] References Cited

U.S. PATENT DOCUMENTS

| | | | |
|---|---|---|---|
| 4,500,932 | 2/1985 | Sato et al. | 360/65 |
| 4,562,492 | 12/1985 | Higurashi | 360/68 |
| 5,051,847 | 9/1991 | Philipps | 360/46 |

*Primary Examiner*—Aristotelis M. Psitos
*Assistant Examiner*—Patrick Wamsley
*Attorney, Agent, or Firm*—Frommer Lawrence & Haug, LLP; William S. Frommer

[57] ABSTRACT

A magnetic recording and reproducing apparatus amplifies a current representing a recording signal reproduced from an information signal recorded on a magnetic tape, suppresses low frequency components of the current amplified signal, then amplifies a voltage representing the suppressed signal. The voltage amplified signal is supplied from a primary winding of a rotary transformer inside a drum to a secondary winding of the rotary transformer disposed outside the drum, and then its low frequency components are emphasized. This avoids the problems of an inadequate S/N in the low frequency components of the output of a voltage amplifier, and difficulty in providing a high voltage signal from a current amplifier. The emphasized signal is supplied to one of a plurality of equalizing circuits that respectively equalize a signal reproduced at one of a plurality of frequencies. The inputs of the equalizing circuits and a terminating resistance are connected to serially located nodes of a transmission line, with higher frequency equalizing circuits disposed closer to the terminating resistance, thereby avoiding introduction of amplitude distortion in the emphasized signal due to reflection along the transmission line.

4 Claims, 6 Drawing Sheets

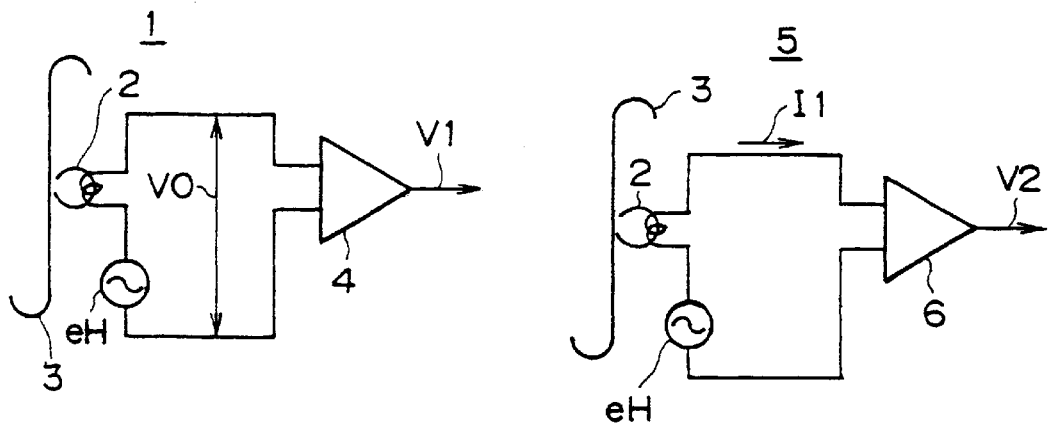
FIG.1A (PRIOR ART)
FIG.1B (PRIOR ART)
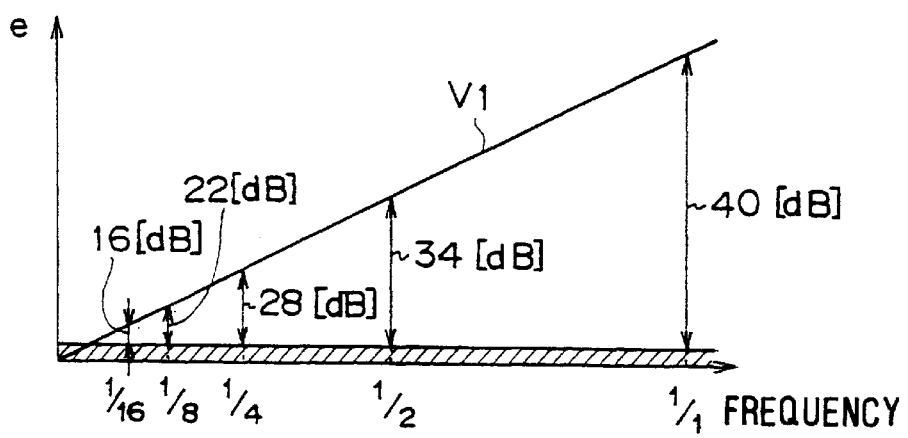
FIG.2 (PRIOR ART)

MAGNETIC RECORDING AND REPRODUCING APPARATUS HAVING A DRUM PREAMPLIFIER WITH IMPROVED S/N AND DYNAMIC RANGE

This application is a continuation division application of application Ser. No. 07/798,183, filed Nov. 26, 1991, now abandoned.

BACKGROUND OF THE INVENTION

The present invention relates to a magnetic recording and reproducing apparatus that reproduces a recorded signal with reduced distortion, and is particularly useful when applied to an apparatus for reproducing an information signal recorded on a magnetic tape by helically scanning the magnetic tape with a rotary head.

A conventional magnetic recording and reproducing apparatus records information data at a high density and reproduces the recorded data by helically scanning the magnetic tape.

In the conventional data recording and reproducing apparatus the information data is modulated for recording by, e.g., an 8–9 modulation method. A record signal thus obtained is equalized by an equalizing circuit, amplified by a recording amplifier circuit, and then supplied to a rotary head mounted on a drum.

The drum is wound with a magnetic tape so that the magnetic tape may travel in an oblique direction. Consequently, the rotary head may helically scan the magnetic tape.

With this data recording and reproducing apparatus, information data is typically recorded at a data rate of 88 [Mbps], corresponding to a maximum recording frequency of 44 [MHz]. On a recording track of the magnetic tape, a magnetizing pattern is formed which is reversed at a minimum interval of 0.9 [$\mu$].

In this type of data recording and reproducing apparatus, a rotating speed of the rotary head and a travelling speed of the magnetic tape are variably controlled to produce a relative speed between the rotary head and the magnetic tape in the direction of the recording track of $1/1$, $1/2$, $1/4$, $1/8$, $1/16$ or $1/24$ times a normal speed. Therefore, information data having data rates of 88, 44, 22, 11, 5.50 or 3.67 [Mbps] can be recorded, corresponding to record signals having maximum recording frequencies of 44, 22, 11, 5.50, 2.25 or 1.84 [MHz].

Specifically, with respect to information data recorded by a record signal having a maximum recording frequency of 44 [MHz] and a data rate of 88 [Mbps], the relative speed between the magnetic tape and the rotary head in the recording track direction is variably controlled at a speed of 2 times a normal speed. This information data is readable as information data having a data rate of 44 [Mpbs]i.e., a maximum reproducing frequency of 22 [MHz]. A low speed reproduction mode at $1/2$ times normal speed is thereby attainable.

Conversely, with respect to information data recorded by a record signal having a data rate of 22 [Mbps] and a maximum recording frequency of 11 [MHz], the relative speed between the magnetic tape and the rotary head is variably-controlled at a speed of $1/1$ times a normal speed. The information data is readable as information data having a data rate of 88 [Mbps], i.e., a maximum reproducing frequency of 44 [MHz]. As a result, a high speed reproduction mode is thereby attainable at 4 times normal speed.

In the case of the conventional data recording and reproducing apparatus, variable-speed recording is, as described above effected at a speed of $1/1$ through $1/24$ times the normal speed. Therefore, with respect to, e.g., observation data which varies slowly as in the case of astronomical observation data, the information data is recorded at a data rate as slow as 3.67 [Mbps] and reproduced at a data rate as high as 88 [Mbps]. The data may thereby be efficiently analyzed in a short time by using, a computer system.

In contrast with this, with respect to measurement data or observation data which varies quickly, the data can be recorded at a data rate as high as 88 [Mbps] and reproduced at a data rate as slow as 3.67 [Hbps]. The data can be more thoroughly analyzed at a low playback speed. With this arrangement, a data recording apparatus, shown in FIG. 1, is usable as a buffer for converting the frequency of the information data containing a large amount of information.

In a reproducing system of the thus constructed data recording and reproducing apparatus, an electromotive force e, induced in the rotary head during reproducing, exhibits a differential characteristic expressed by the following formula:

$$e = -N \frac{d\phi}{dt} \tag{1}$$

where N is the output of the rotary head. Supposing that a frequency characteristic of the magnetic tape is flat, the electromotive force e exhibits a characteristic rising at 6 [dB] per octave.

If a preamplifier disposed within the drum and comprised of a voltage type amplifier circuit having a given noise level is used to amplify the reproducing output, then the signal-to-noise ratio (S/N) of the signal output from the preamplifier decreases with a decrease in the frequency of the signal.

As illustrated in FIG. 1A, in the reproducing system of such a data recording and reproducing apparatus 1, the information data recorded on a magnetic tape 3 is read by helically scanning the magnetic tape 3 with a rotary head 2 having an electromotive force eH. A head output voltage V0 thereby obtained is amplified by a preamplifier 4 comprised of a voltage type amplifier circuit and then supplied as a reproducing Output V1.

Where the voltage type amplifier circuit is employed in the preamplifier 4 for performing variable-speed recording and reproducing in the manner discussed above, the carrier-to-noise ratio (C/N) of the reproducing output V1 has a characteristic as shown in FIG. 2.

More specifically, when the C/N in the shortest wavelength used for reproducing is 40 [dB], measured in a frequency band of 100 [KHz] at the fastest relative speed, i.e., a $1/1$ times normal speeds the C/N is reduced by 6 [dB] as the relative speed between the magnetic tape and the rotary head is slowed by factors of $1/2$, $1/4$, $1/8$, $1/16$ and $1/24$. As a result, particularly at the $1/16$ and $1/24$ times normal speeds, the reproducing output V1 can not be satisfactorily obtained.

Therefore, in the data recording and reproducing apparatus 1 capable of variable-speed recording and reproducing at all the relative speeds listed above, it is impossible to use such a voltage type amplifier circuit for the preamplifier 4.

For this reason, in a data recording and reproducing apparatus which has a variable-speed recording and reproducing mode, a preamplifier comprised of a current type amplifier circuit having an input impedance of approximately "0" is advantageous in terms of its C/N.

FIG. 1B shows a reproducing system of such a data recording and reproducing apparatus 5 in which information data recorded on the magnetic tape 3 is read by the rotary head 2 having an electromotive force eH. A head output current I1 thus obtained is amplified by a preamplifier 6 comprised of a current type amplifier circuit and then supplied as a reproducing output V2.

The electromotive force eH of the rotary head 2 has a characteristic which rises at 6 [dB] per octave. Correspondingly, an impedance Z of the rotary head 2 exhibits a characteristic which rises at 6 [dB] per octave, as expressed by the following formula:

$$Z=WL \tag{2}$$

Consequently, if an input impedance of the preamplifier 6 is set to almost "0", the frequency characteristic with respect to an input current becomes substantially flat. As a result, the C/N does not vary depending on the frequency.

The amplification characteristic solely of the preamplifier 6 comprised of the current type amplifier circuit has a characteristic which rises at 6dB per octave. Hence, a noise characteristic TN, illustrated in FIG. 3A, appears due to the input impedance noise and the like. A lower input impedance is advantageous in terms of noise caused by the preamplifier 6. Thus, the preamplifier 6 comprised of the current type amplifier circuit is more advantageous in terms of the C/N than the preamplifier 4 comprised of the voltage type amplifier circuit.

In actual magnetic recording and reproducing operations, however, a magnetic conversion characteristic of the rotary head 2 exerts an influence. For this reason, as illustrated in FIG. 3B, an amplitude characteristic of the reproducing output V2 from the preamplifier generally increases in a long wavelength region.

Therefore, if the S/N and the dynamic range are considered, including the effects of the driver of the rotary transformer from the next and subsequent stages of the preamplifier 6 within the drum, and when trying to secure a signal level for the reproducing output V2 of at least 56 [dB] greater than a noise level N1 of the preamplifier 6 when the noise level N1 is 100 [$\mu$V], then the reproducing output V2 requires a signal level of approximately 63 [mV] at the shortest wavelength $\lambda$ of 0.9 [$\mu$m].

When the signal output from the rotary head 2 has a wavelength of 18 [$\mu$m], the reproducing output V2 of the preamplifier 6 has a signal level of approximately 2 [V], as can be seen from FIG. 3B.

However, in view of the current capacity of the preamplifier 6 within the drum and the electric power of an integrated circuit, it is difficult to provide a signal level as high as 2 [V]. Therefore, when using the preamplifier 6 comprised of the current type amplifier circuit there is a problem with respect to the S/N, namely, that the dynamic ranges of the amplifiers of the next and subsequent stages cannot be attained particularly with respect to low frequency components.

Furthermore, in the thus constructed data recording and reproducing apparatus, the frequency band used for a recording signal changes among the frequencies of 44 to 1.84 [MHz] as the data rate of information data recorded as described above changes.

Therefore, it is necessary to equalize the reproducing signal using an equalizing characteristic which depends on the frequency of the reproducing signal, to ensure compatibility with the respective data rates on the magnetic tape.

To accomplish such frequency dependent equalizations, the data recording and reproducing apparatus as described above includes a plurality of equalizing circuits having equalizing characteristics corresponding to the frequencies available for the reproducing signal. The equalizing circuits are selectively used by means of a branch circuit 21 shown in FIG. 4.

In the branch circuit 21, via an input buffer 22 and an input resistance R1, a reproducing output is applied to a transmission line having serially disposed connection nodes to which input selection switches 23, 24 and 25, each comprised of an analog switch, are respectively connected. The transmission line is terminated at one end of a terminating resistance R0, the other end of which is connected to a ground.

The input selection switches 23, 24 and 25 are selectively controlled so that the reproducing signals SA, SB and SC supplied from each output terminal of the input selection switches 23, 24 and 25 are inputted to equalizers (not shown) which have respectively different equalizing characteristics.

Let T be a delay time for each line between adjacent connection nodes. Then, the signals SA, SB and SC supplied from the input selection switches 23, 24 and 25 are respectively expressed by the following formulae:

$$SA=Ee^{j\omega t} \tag{3}$$

$$SB=Ee^{j\omega(t+T)} \tag{4}$$

$$SC=Ee^{j\omega(t+2T)} \tag{5}$$

If the line and the terminating resistance R0 are mismatched, then the signals SA, SB and SC are respectively distorted, as expressed by the following formula:

$$SA=Ee^{j\omega t}+kEe^{j\omega(t+4T)} \tag{6}$$

$$SB=Ee^{j\omega(t+T)}+kEe^{j\omega(t+2T)} \tag{7}$$

$$SC=Ee^{j\omega(t+2T)} \tag{8}$$

SUMMARY OF THE INVENTION

Therefore, an object of the present invention is to provide a magnetic recording and reproducing apparatus which avoids the aforementioned disadvantages of the prior art.

Another object of the present invention is to provide a magnetic recording and reproducing apparatus having a drum with a reproducing amplifier that has a good S/N and a large dynamic range.

A further object of this invention is to avoid amplitude distortion caused by reflection in a magnetic recording and reproducing apparatus in which reproducing outputs are commonly inputted to a plurality of equalizing circuits.

The foregoing objects and other objects of the invention have been achieved by the provision of a magnetic recording and reproducing apparatus in which a current amplifier amplifies a current representing a signal produced when a rotary head mounted on a drum helically scans an information signal recorded on a magnetic tape wound around the drum. The low frequency components in the current amplified signal are suppressed, then a voltage representing the suppressed signal is amplified, and supplied to a primary winding of a rotary transformer that is disposed inside the drum. A secondary winding of the rotary transformer is disposed outside the drum and supplies the voltage amplified signal to a lower band emphasis circuit which emphasizes the low frequency components previously suppressed.

In a magnetic recording and reproducing apparatus according to the present invention, the emphasized signal is supplied to a transmission line having an input side resistor connected thereto. A plurality of switches are respectively connected between the transmission line and a plurality of equalizing circuits, which each equalize the emphasized signal in accordance with a respective one of a plurality of frequencies at which the rotary head can scan the information signal. The equalizing circuits are arranged so that the distances between each of them and the input side resistor increase as the respective frequencies corresponding to each of the equalizing circuits decrease.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIGS. 1A and 1B are block diagrams illustrating conventional data recording and reproducing apparatus;

FIGS. 2, 3A and 3B are diagrams of frequency characteristics referenced in explaining conventional apparatus;

FIG. 5C is a diagram of a drum according to the present invention;

DETAILED DESCRIPTION OF THE PREFERRED EMBODIMENT

Figure 3A:
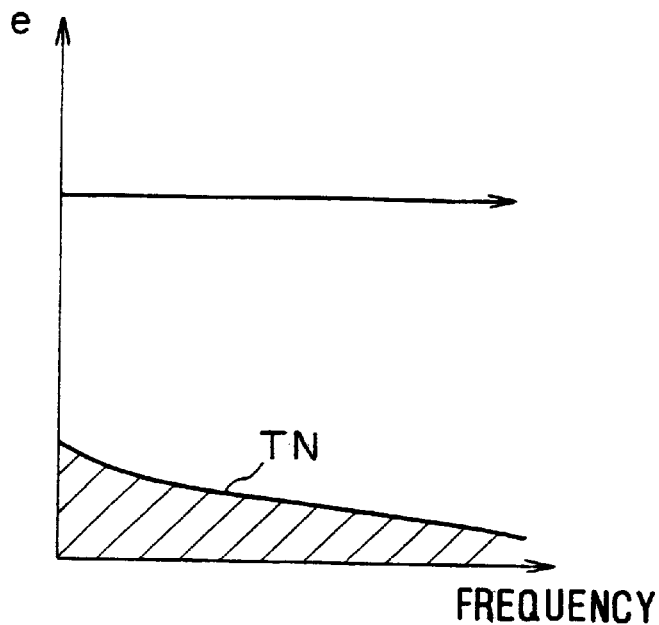
Figure 3B:
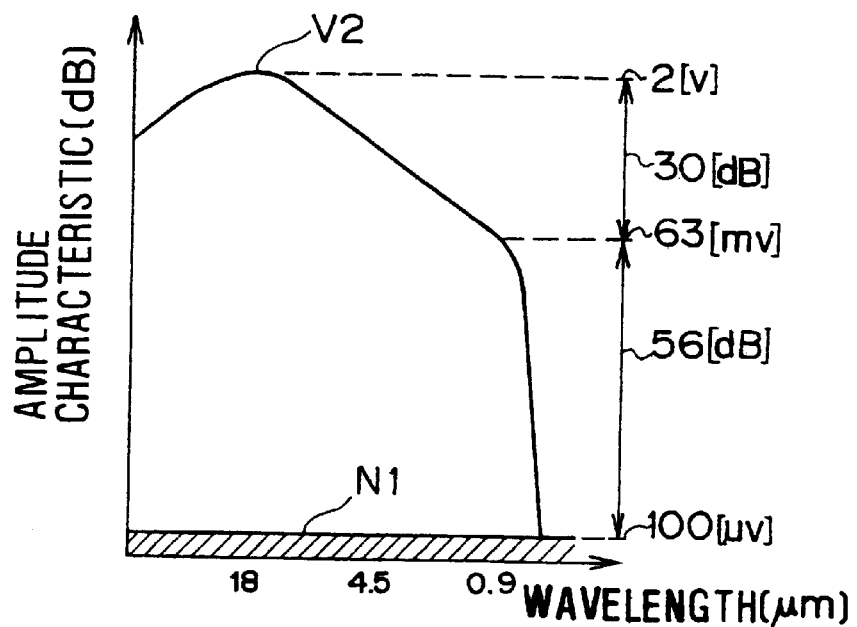
Figure 4:
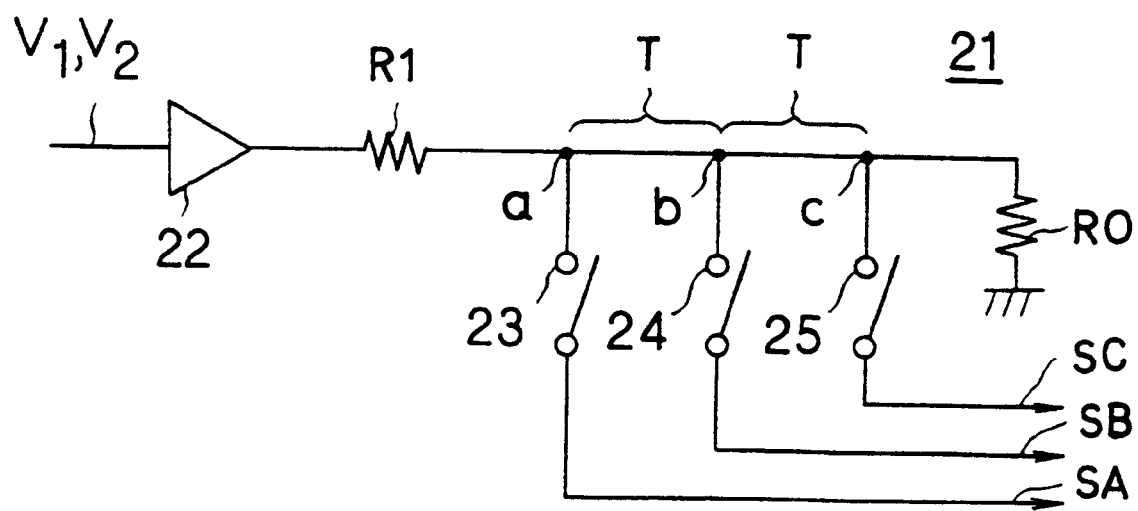
FIG. 4 is a block diagram showing a conventional branch circuit.
Figure 5A:
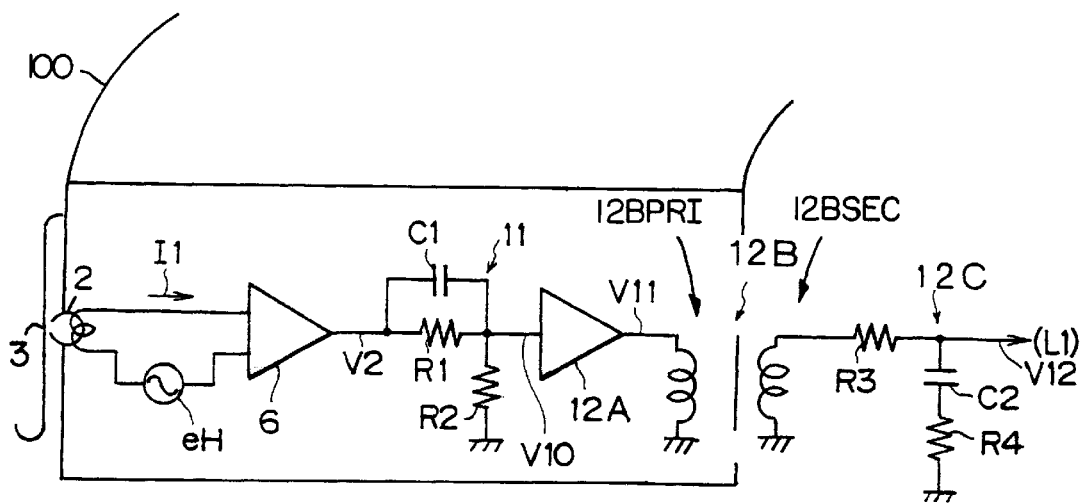
FIGS. 5A and 5B are block diagrams showing an embodiment of a data recording and reproducing apparatus according to the present invention.
Figure 5B:
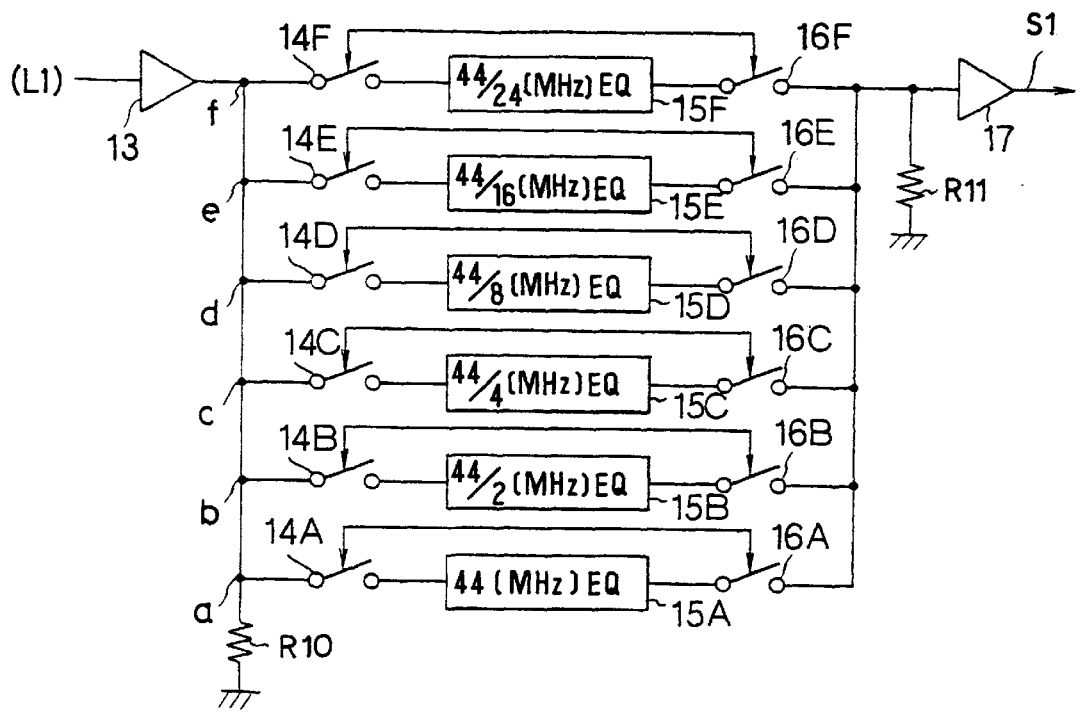

Referring to FIGS. 5A and 5B, wherein the elements corresponding to those in FIGS. 1–4 are marked with the same reference characters, the numeral 10 generally designates a data recording and reproducing apparatus according to the present invention. A rotary head 2 disposed in the interior of a rotary drum 100 reads a magnetic tape and supplies a head output current I1 obtained from reading the tape 3 to a preamplifier 6.

The preamplifier 6 is comprised of a current type amplifier circuit and amplifies the head output current I1, then applies the amplified current as a first reproducing output V2 to an emphasis circuit 11.

The emphasis circuit 11 is constructed of an RC differentiating circuit including resistances R1, R2 and a capacitor C1. The emphasis circuit 11 suppresses low frequency components of the first reproducing output V2 and supplies the suppressed signal as a second reproducing output V10 to a driver 12A comprising a voltage type amplifier circuit.

The driver 12A amplifies the second reproducing output V10 supplied thereto and applies the thus amplified signal as a third reproducing output V11 to a primary winding 12BPRI of a rotary transformer 12B. A secondary winding 12BSEC of the transformer 12B supplies output V11 to a de-emphasis circuit 12C disposed outwardly of the drum 100.

The de-emphasis circuit 12C is comprised of an RC integrating circuit including resistances R3, R4 and a capacitor C2. The de-emphasis circuit 12C emphasizes a low frequency component of the third reproducing output V11 and supplies the thus emphasized signal as a fourth reproducing output V12 to a reproducing signal processing circuit of a following circuit stage.

The de-emphasis circuit 12C has a characteristic complementary to the characteristic of the emphasis circuit 11, and emphasizes the low frequency components suppressed by the emphasis circuit 11, thereby compensating the low frequency components suppressed by the emphasis circuit 11.

As discussed above, in the data recording and reproducing device 10, the preamplifier 6 amplifies a level of the head output current I1 enough to obtain the first reproducing output V2. Low frequency components of this reproducing output V2, which may cause a problem with regard to a noise level in the driver 12A, are suppressed by the emphasis circuit 11 and then the second reproducing output V10 is supplied to the driver 12A. Thus, the preamplifier 6 within the drum provides a good S/N and a large dynamic range.

Figure 6A:
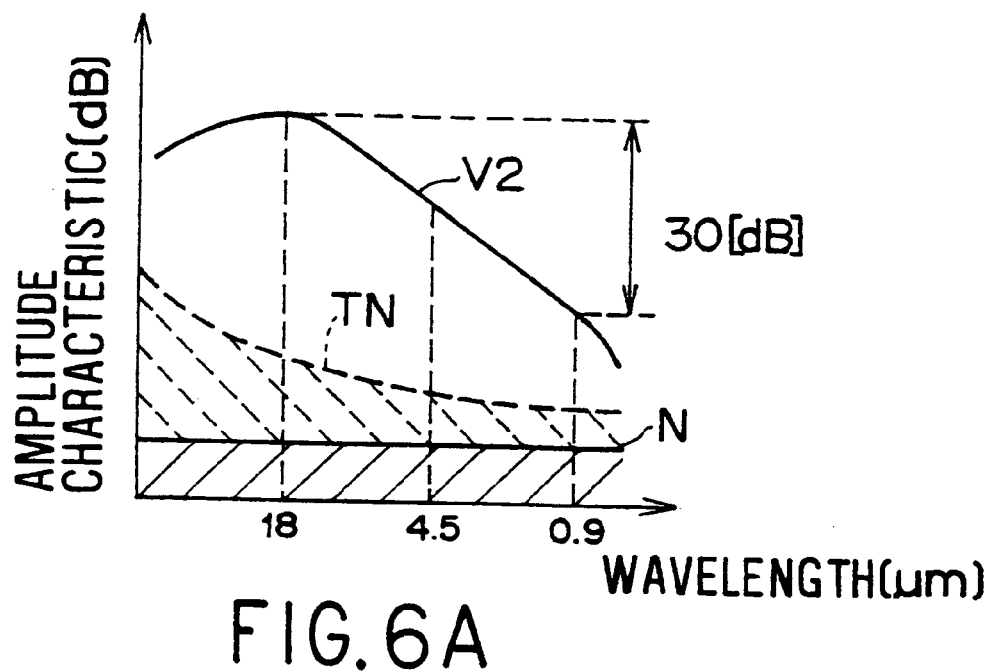
FIGS. 6A to 6D are characteristic curve diagrams to which reference will be made in explaining the operation of the apparatus shown in FIGS. 5A and 5B.

Specifically, the first reproducing output V2 obtained from the preamplifier 6 has a frequency characteristic illustrated in FIG. 6A reflecting magnetic conversion characteristics of the magnetic tape 3 and the rotary head 2, a noise TN introduced by the preamplifier 6. The noise TN and a noise N introduced by the driver 12A have, as previously explained, the respective frequency characteristics shown in FIG. 6A.

Figure 6B:
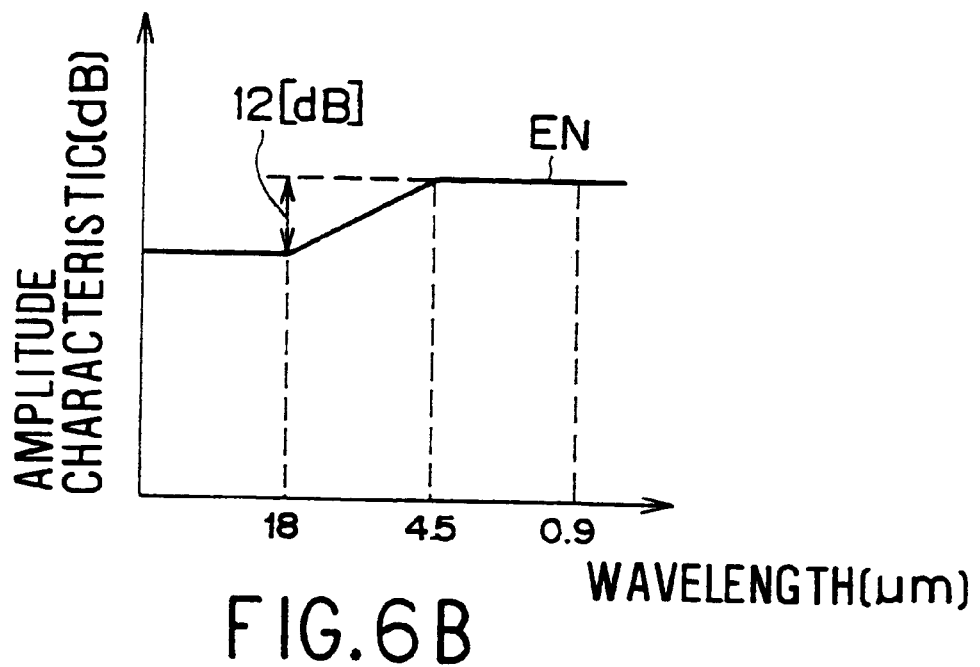

The emphasis circuit 11 has, as shown in FIG. 6B, a suppression characteristic EN which reduces by 12 [dB] the low frequency components of the reproducing output V2 that have a record wavelength of 18 [μm] or more.

Figure 6C:
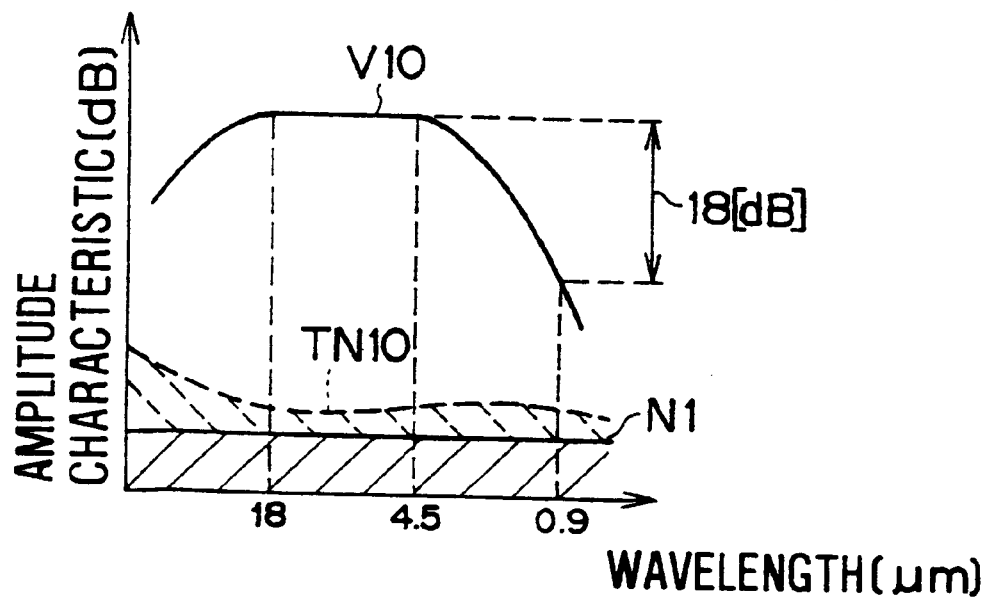

Hence, in the second reproducing output V10 supplied from the emphasis circuit 11 to the driver 12A, which contains the noise signal TN10, the low frequency components of the first reproducing output V2 and of the noise TN associated with the preamplifier 6 are suppressed, as can be seen from FIG. 6C. Thus, the low frequency components which cause a noise problem in the driver 12A are sufficiently suppressed. That is, when the driver 12A sufficiently amplifies the second reproducing output V10, the third reproducing output V11 is produced with the desired dynamic range. This reproducing output V11 is transmitted via the rotary transformer 12B to the de-emphasis circuit 12C.

Figure 6D:
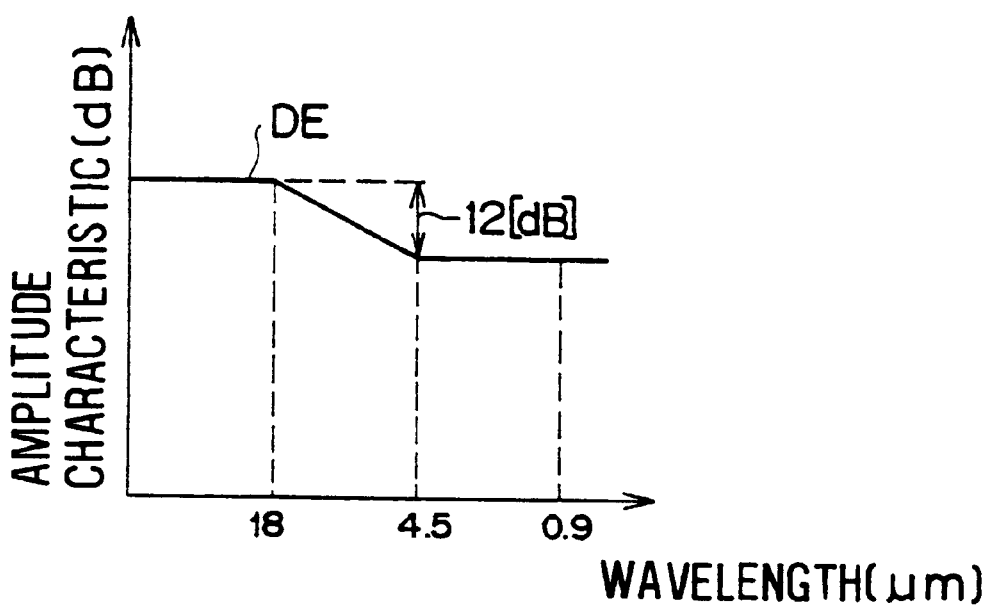

The de-emphasis circuit 12C has, as illustrated in FIG. 6D, an emphasis characteristic DE which increases by 12[dB] the low frequency components of the third reproducing output V11 having a record wavelength of 18 [μm] or more, that is, an emphasis is characteristic DE which is complementary to the suppression characteristic EN of the emphasis circuit 11. A power source voltage and electric power following the rotary transformer 12B are thereby secured enough. After such processing, the frequency characteristic of the third reproducing output V11 is returned to substantially the frequency characteristic of the first reproducing output V2.

The fourth reproducing output V12 is, as shown in FIG. 5B, supplied to an input buffer 13 and therefrom to a series of connection nodes respectively leading to input selection switches 14A, 14B, 14C, 14D, 14E and 14F, which are each comprised of an analog switch and are respectively connected to equalizing circuits 15A, 15B, 15C, 15D, 15E and 15F. The last node at the end of the series of connection nodes is attached to one end of an input side terminating resistance R10, the other end of which is connected to a ground, as shown in FIG. 5B The input selection switches 14A–14F are selectively controlled so that the fourth reproducing output V12 is inputted to one of the equalizing circuits 15A, 15B, 15C, 15D, 15E and 15F.

Here, the nearer a node is to the terminating resistance R10, the smaller is the influence of amplitude distortion by reflection, and the further a node is from the terminating resistance R10, the larger is the influence of amplitude distortion by reflection, as clearly indicated from the formulae (6) to (8).

The equalizing circuits 15A–15F are respectively selected so as to have equalizing characteristics corresponding to maximum reproducing frequencies of 44 [MHz], 44/2 (=22) [MHz], 44/4 (=11) [MHz], 44/8 (=5.50) [MHz], 44/16 (=2.25) [MHz] and 44/24 (=1.84) [MHz] in order of proximity to the terminating resistance R10. Amplitude distortion by reflection is thereby avoided.

In actuality, on a printed circuit board, the equalizing circuits 15A–15F are arranged with circuit patterns in order of proximity to the resistance R10, as described above.

The components of the fourth reproducing output signal are equalized in one of the equalizing circuits 15A–15F corresponding to a respective one of the reproducing frequencies 44–1.84 [MHz] and then supplied to one of output selection switches 16A–16F, each comprised of an analog switch.

Interlocking with the input selection switches 14A–14F, one of the output selection switches 16A–16F is selectively controlled to supply an equalized signal to an input of an output buffer 17 and also to one end of an output side terminating resistance Rll e the other end of which is connected to a ground. The output buffer 17 outputs a signal S1 to a following stage of the magnetic recording and reproducing apparatus.

Through the construction as described above, e the fourth reproducing output V12 is applied to one of the equalizing circuits 15A–15F which are connected so that equalizing characteristics corresponding to maximum recording frequencies that are higher in frequency are closer to the terminating resistance R10. Thus, it is possible to realize the data recording and reproducing apparatus 10, in which amplitude distortion by reflection is avoided.

Based on the construction given above, the preamplifier 6 sufficiently amplifies the level of the head output current I1 so as to obtain the first reproducing output V2. The low frequency components in the output V2 which may cause a problem with respect to the noise level in the driver 12A are suppressed and then the thus suppressed signal is inputted to the driver 12A. The power source voltage and electric power following the rotary transformer 12B are thereby sufficiently secured. After processing by the de-emphasis circuit 12C, the frequency characteristic is returned to its original condition. It is thus possible to attain the data recording and reproducing apparatus 10 in which the preamplifier 6 in the drum is capable of sufficiently securing the S/N and the dynamic range.

Note that the emphasis circuit 11 and the de-emphasis circuit 12C discussed in the embodiment given above have characteristics so as to depress and raise the low frequency components having the record wavelength of 18 [μm] or more, but the present invention is not limited to the record wavelength of 18 [μm] or more and may be set to a variety of values after considering the noise characteristics. In short, the same effects as those described above are attainable by setting the de-emphasis circuit at the outside of the drum to a characteristic which raises the low frequency components by a value complementary to the suppression occurring in the emphasis circuit inside of the drum.

In the embodiment discussed above, the present invention is applied to a data recording and reproducing apparatus but it is not limited to this. The present invention is suitable for wider application to a magnetic recording and reproducing apparatus such as, e.g., a digital video tape recorder and a digital audio tape recorder for recording and reproducing by helically scanning a magnetic tape with a rotary head mounted on a drum.

Further, in the construction given above, the fourth reproducing output V12 is applied to one of the equalizing circuits 15A–15F which are connected so that equalizing characteristics corresponding to maximum reproducing frequencies that are higher in frequency are closer to the terminating resistance R10. Thus, it is possible to realize the data recording and reproducing apparatus 10, in which amplitude distortion by reflection is avoided.

In the embodiment described aboveg the switches 14A–14F and 16A–16F interlocked with each other were respectively disposed at inputs and outputs of the equalizing circuits 15A–15F, but the present invention is not limited to this. The present invention may be applied where switches disposed at either the input side or the output side of the equalizing circuits may be selectively controlled.

Further in the embodiment described above, the present invention was applied to the reproducing signal processing circuit of the data recording and reproducing apparatus, but the present invention is not limited to this. The present invention may also be applied to an equalizing circuit in a recording signal processing circuit.

In the embodiment described above, the present invention was applied to the equalizing circuit of a data recording and reproducing apparatus, but the present invention is not limited to this. The present invention may also be applied to a frequency signal processing apparatus in which a frequency signal is commonly inputted to signal processing circuits connected in parallel with each other and comprised of, for example, a plurality of low pass filters, or a plurality of tuners, or the like.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A magnetic recording and reproducing apparatus having a drum around which a magnetic tape is wound, comprising:

a rotary head mounted on said drum for helically scanning said magnetic tape so as to reproduce an information signal recorded on said magnetic tape;

current amplification means disposed inside said drum near said rotary head for amplifying a current representing the reproduced information signal to produce a first reproducing signal;

lower band suppression means disposed inside said drum for suppressing low frequency components of said first reproducing signal to produce a second reproducing signal;

voltage amplification means disposed inside said drum for amplifying a voltage representing said second reproducing signal to produce a third reproducing signal;

a rotary transformer having a primary winding disposed inside said drum for receiving said third reproducing signal, and a secondary winding disposed outside said drum for supplying said third reproducing signal received at said primary winding; and lower band emphasis means disposed outside said drum for emphasizing said low frequency components suppressed by said lower band suppression means in said third reproducing signal supplied from said secondary winding of said rotary transformer to produce a fourth reproducing signal.

2. The magnetic recording and reproducing apparatus according to claim 1, wherein said information signal is recorded on said magnetic tape with at least one of a plurality of frequencies using a predetermined recording wavelength, and said rotary head helically scans said information signal with one of said plurality of frequencies.

3. The magnetic recording and reproducing apparatus according to claim 2, further comprising:

means for equalizing said fourth reproducing signal, including transmission line means for supplying said fourth reproducing signal, input side resistance means connected to said transmission line means, a plurality of equalizing means, each for egualizing said fourth reproducing signal at a respective one of said plurality of frequencies, a plurality of switch means connected between said transmission line and respective ones of said plurality of equalizing means for supplying said fourth reproducing signal to a selected one of said egualizing means;

and wherein respective distances between each of said equalizing means and said input side resistance means increase as respective frequencies corresponding to said each of said equalizing means decrease.

4. The magnetic recording and reproducing apparatus according to claim 1, wherein:

said information signal is a digital signal.

* * * * *